United States Patent
Ma (10) Patent No.: US 12,032,776 B2
(45) Date of Patent: Jul. 9, 2024

(54) DISPLAY PANEL AND MOBILE TERMINAL

(71) Applicant: WUHAN CHINA STAR OPTOELECTRONICS SEMICONDUCTOR DISPLAY TECHNOLOGY CO., LTD., Hubei (CN)

(72) Inventor: Liang Ma, Hubei (CN)

(73) Assignee: WUHAN CHINA STAR OPTOELECTRONICS SEMICONDUCTOR DISPLAY TECHNOLOGY CO., LTD., Hubei (CN)

( * ) Notice: Subject to any disclaimer, the term of this patent is extended or adjusted under 35 U.S.C. 154(b) by 0 days.

(21) Appl. No.: 17/623,209

(22) PCT Filed: Dec. 23, 2021

(86) PCT No.: PCT/CN2021/140972
§ 371 (c)(1),
(2) Date: Dec. 27, 2021

(87) PCT Pub. No.: WO2023/115485
PCT Pub. Date: Jun. 29, 2023

(65) Prior Publication Data
US 2024/0028153 A1 Jan. 25, 2024

(30) Foreign Application Priority Data

Dec. 21, 2021 (CN) .......................... 202111569857.1

(51) Int. Cl.
*G06F 3/041* (2006.01)
*G06F 3/044* (2006.01)
*H10K 59/40* (2023.01)

(52) U.S. Cl.
CPC ........ *G06F 3/04164* (2019.05); *G06F 3/0412* (2013.01); *G06F 3/0443* (2019.05); *G06F 3/0448* (2019.05); *H10K 59/40* (2023.02)

(58) Field of Classification Search
CPC ...... H10K 59/40; G06F 3/0416–04186; G06F 3/0412; G06F 3/044–0448
See application file for complete search history.

(56) References Cited

U.S. PATENT DOCUMENTS

2015/0084912 A1* 3/2015 Seo .................. G06F 3/0412
345/174
2017/0351132 A1 12/2017 Kanari
(Continued)

FOREIGN PATENT DOCUMENTS

CN 111665998 A 9/2020
CN 111694466 A 9/2020
(Continued)

OTHER PUBLICATIONS

International Search Report in International application No. PCT/CN2021/140972, mailed on Sep. 14, 2022.
(Continued)

*Primary Examiner* — Hang Lin
(74) *Attorney, Agent, or Firm* — PV IP PC; Wei Te Chung; Zhigang Ma (57) ABSTRACT

A display panel and a display terminal are provided. Touch wires include a first touch wiring portion arranged along a first direction and a second touch wiring portion arranged along a second direction. Through an arrangement of the second touch wiring portion, the touch wires are concentrated and extended from a display area to a non-display area. Touch binding terminals can be designed in a central-
(Continued)

ized manner, and a width of a frame on which the touch binding terminals are arranged in the first direction and the second direction is reduced.

18 Claims, 4 Drawing Sheets

(56) References Cited

U.S. PATENT DOCUMENTS

| | | | |
|---|---|---|---|
| 2018/0364845 A1* | 12/2018 | Lee | G06F 3/0445 |
| 2022/0197417 A1* | 6/2022 | Ye | G06F 3/04164 |

FOREIGN PATENT DOCUMENTS

| | | |
|---|---|---|
| CN | 112162654 A | 1/2021 |
| CN | 213241110 U | 5/2021 |
| CN | 113064510 A | 7/2021 |
| CN | 113325970 A | 8/2021 |
| CN | 114237422 A | 3/2022 |
| CN | 114237424 A | 3/2022 |
| CN | 114265516 A | 4/2022 |

OTHER PUBLICATIONS

Written Opinion of the International Search Authority in International application No. PCT/CN2021/140972, mailed on Sep. 14, 2022.

* cited by examiner

DISPLAY PANEL AND MOBILE TERMINAL

FIELD OF INVENTION

The present application relates to the field of display technologies, and more particularly to a display panel and a display terminal.

BACKGROUND OF INVENTION

Display panels have been widely used in people's lives, such as display screens of mobile phones and computers. With the development of display technology and people's requirements for the progress of display technology, people have higher and higher requirements for a display quality of a display panel. It has been developed to fabricate a touch layer on a surface of an encapsulation layer of an organic light emitting display panel. The touch layer includes touch electrodes and touch wires. The touch wire is electrically connected to the corresponding touch electrode. The touch electrodes are arranged in a plurality of touch electrode columns along a first direction. The touch electrodes are arranged in a plurality of touch electrode rows along a second direction. The touch electrodes include metal mesh touch electrode units.

Figure 1:
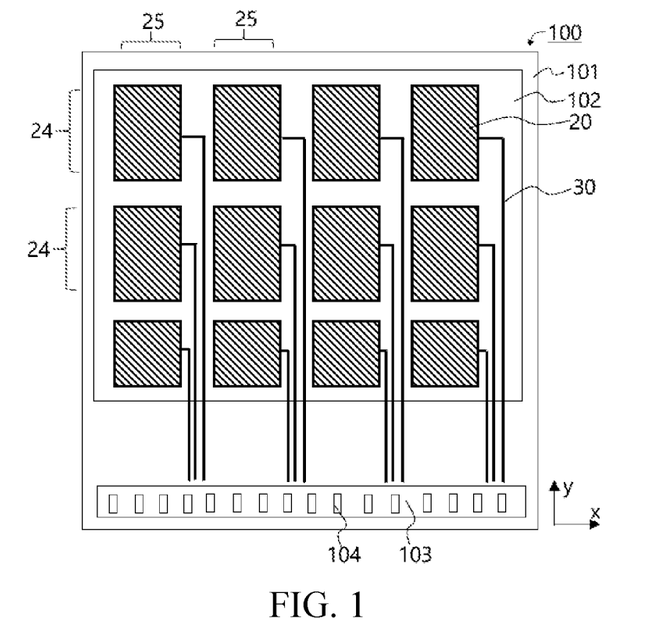
FIG. 1 is a schematic diagram of an arrangement of a touch layer in the prior art.

However, as shown in FIG. 1, FIG. 1 illustrates an arrangement of a touch layer in a display panel 100 in the prior art. The touch layer includes touch electrodes 20. Touch wires 30 located in a display area 102 all extend along a first direction y. The touch wires 30 connected to each touch electrode column 25 all extend from near one end of the touch electrode column 25 to a non-display area 101 and are electrically connected to a touch binding terminal 104 of a binding terminal 103.

However, this arrangement in the prior art has an unreasonable layout of the touch wires 30 in the non-display area 101. This makes a blind area of the non-display area 101 larger, and it is difficult to centrally design the multiple touch binding terminals 104. This makes a width of a frame of the touch binding terminal 104 larger in the first direction y and the second direction x, which is not conducive to a light and narrow frame design of the display panel 100.

Technical Problem

The embodiments of the present application provide a display panel and a display terminal to solve technical problems of unreasonable layout of touch wires in a non-display area in the prior art, which makes a blind area of the non-display area larger, is difficult to centrally design multiple touch binding terminals, makes a width of a frame of the touch binding terminal larger in a first direction and a second direction x, and is not conducive to a light and narrow frame design of the display panel.

SUMMARY OF INVENTION

An embodiment of the present application provides a display panel, wherein the display panel includes:
a light emitting layer comprising light emitting pixels arranged along a first direction and a second direction, wherein the first direction is different from the second direction;
a touch layer disposed on a side of the light emitting layer, wherein the touch layer comprises touch electrodes and touch wires electrically connected to corresponding touch electrodes;

wherein the touch wires comprise a first touch wiring portion provided along the first direction and a second touch wiring portion provided along the second direction;
wherein the first touch wiring portion comprises a plurality of first wiring portions arranged along the first direction and arranged on a side adjacent to the light emitting pixel, a plurality of first connecting portions arranged along the first direction and connected to adjacent first wiring portions, and first protruding portions arranged on a side of the first wiring portion and arranged along the second direction, and at least two first protruding portions are provided on a side of one of the first wiring portions;
wherein the second touch wiring portion comprises a plurality of second wiring portions arranged along the second direction and arranged on a side adjacent to the light emitting pixel, a plurality of second connecting portions arranged along the second direction and connected to adjacent second wiring portions, and second protruding portions arranged on a side of the second wiring portion and arranged along the first direction, and at least two second protruding portions are provided on a side of one of the second wiring portions.

Optionally, in some embodiments of the present application, the first wiring portion of one of the touch wires and an adjacent first wiring portion of an adjacent one of the touch wires are respectively arranged on both sides of the same light emitting pixel, or
the first protruding portion on the first wiring portion of one of the touch wires and the first protruding portion on the adjacent first wiring portion of the adjacent one of the touch wires are arranged opposite to each other.

Optionally, in some embodiments of the present application, an end of the first protruding portion is connected to the adjacent first wiring portion, and another end of the first protruding portion extends along the second direction;
an end of the second protruding portion is connected to the adjacent second wiring portion, and another end of the second protruding portion extends along the first direction.

Optionally, in some embodiments of the present application, the adjacent first touch wiring portions of the two adjacent touch wires comprise a plurality of first repeating units surrounding the light emitting pixels, the first repeating unit comprises two adjacent first wiring portions, the first connecting portion connected to the first wiring portion, and the first protruding portion;
the adjacent second touch wiring portions of the two adjacent touch wires comprise a plurality of second repeating units surrounding the light emitting pixels, the second repeating unit comprises two adjacent second wiring portions, the second connecting portion connected to the second wiring portion, and the second protruding portion;
the first repeating unit and the second repeating unit are arranged rotationally symmetrically.

Optionally, in some embodiments of the present application, in the same first repeating unit, two adjacent first wiring portions are arranged asymmetrically;
in the same second repeating unit, two adjacent second wiring portions are arranged asymmetrically.

Optionally, in some embodiments of the present application, a side of the first wiring portion is correspondingly provided with two first protruding portions, and a side of the second wiring portion is correspondingly provided with two second protruding portions.

Optionally, in some embodiments of the present application, the first direction is perpendicular to the second direction, and the first repeating unit and the second repeating unit are arranged symmetrically with a rotation of 90 degrees.

Optionally, in some embodiments of the present application, each of the touch electrodes comprises a plurality of electrode units arranged in an array along the first direction and the second direction, the electrode unit has an asymmetric shape, the electrode unit comprises a first electrode unit and a second electrode unit, and the first electrode unit and the second electrode unit are arranged rotationally symmetrically;
  in the first direction, the first electrode unit and the second electrode unit are alternately arranged in the same touch electrode; and/or
  in the second direction, the first electrode unit and the second electrode unit are alternately arranged in the same touch electrode.

Optionally, in some embodiments of the present application, the first electrode unit and the second electrode unit are arranged symmetrically rotated by 90 degrees.

Optionally, in some embodiments of the present application, a shape of the first electrode unit is same as a shape of the first repeating unit, and a shape of the second electrode unit is same as a shape of the second repeating unit.

Optionally, in some embodiments of the present application, the display panel comprises a display area and a non-display area disposed around the display area, the touch electrodes are arranged along the first direction to form a plurality of touch electrode columns, and the touch electrodes are arranged along the second direction to form a plurality of touch electrode rows;
  a blank area disposed between an end of each touch electrode column and an edge of the display area, and at least a part of the touch wire is located in the blank area.

Optionally, in some embodiments of the present application, at least a part of the blank area further comprises blank touch electrodes, the blank touch electrodes are floating, and the blank touch electrodes comprise the same first electrode unit and the second electrode unit as the touch electrodes of the display area.

Correspondingly, an embodiment of the present application further provides a display terminal comprising a terminal body and a display panel, wherein the terminal body and the display panel are combined into one body, and the display panel comprises:
  a light emitting layer comprising light emitting pixels arranged along a first direction and a second direction, wherein the first direction is different from the second direction;
  a touch layer disposed on a side of the light emitting layer, wherein the touch layer comprises touch electrodes and touch wires electrically connected to corresponding touch electrodes;
  wherein the touch wires comprise a first touch wiring portion provided along the first direction and a second touch wiring portion provided along the second direction;
  wherein the first touch wiring portion comprises a plurality of first wiring portions arranged along the first direction and arranged on a side adjacent to the light emitting pixel, a plurality of first connecting portions arranged along the first direction and connected to adjacent first wiring portions, and first protruding portions arranged on a side of the first wiring portion and arranged along the second direction, and at least two first protruding portions are provided on a side of one of the first wiring portions;
  wherein the second touch wiring portion comprises a plurality of second wiring portions arranged along the second direction and arranged on a side adjacent to the light emitting pixel, a plurality of second connecting portions arranged along the second direction and connected to adjacent second wiring portions, and second protruding portions arranged on a side of the second wiring portion and arranged along the first direction, and at least two second protruding portions are provided on a side of one of the second wiring portions.

Optionally, in some embodiments of the present application, the first wiring portion of one of the touch wires and an adjacent first wiring portion of an adjacent one of the touch wires are respectively arranged on both sides of the same light emitting pixel, or
  the first protruding portion on the first wiring portion of one of the touch wires and the first protruding portion on the adjacent first wiring portion of the adjacent one of the touch wires are arranged opposite to each other.

Optionally, in some embodiments of the present application, an end of the first protruding portion is connected to the adjacent first wiring portion, and another end of the first protruding portion extends along the second direction;
  an end of the second protruding portion is connected to the adjacent second wiring portion, and another end of the second protruding portion extends along the first direction.

Optionally, in some embodiments of the present application, the adjacent first touch wiring portions of the two adjacent touch wires comprise a plurality of first repeating units surrounding the light emitting pixels, the first repeating unit comprises two adjacent first wiring portions, the first connecting portion connected to the first wiring portion, and the first protruding portion;
  the adjacent second touch wiring portions of the two adjacent touch wires comprise a plurality of second repeating units surrounding the light emitting pixels, the second repeating unit comprises two adjacent second wiring portions, the second connecting portion connected to the second wiring portion, and the second protruding portion;
  the first repeating unit and the second repeating unit are arranged rotationally symmetrically.

Optionally, in some embodiments of the present application, in the same first repeating unit, two adjacent first wiring portions are arranged asymmetrically;
  in the same second repeating unit, two adjacent second wiring portions are arranged asymmetrically.

Optionally, in some embodiments of the present application, a side of the first wiring portion is correspondingly provided with two first protruding portions, and a side of the second wiring portion is correspondingly provided with two second protruding portions.

Optionally, in some embodiments of the present application, the first direction is perpendicular to the second direction, and the first repeating unit and the second repeating unit are arranged symmetrically with a rotation of 90 degrees.

Optionally, in some embodiments of the present application, each of the touch electrodes comprises a plurality of electrode units arranged in an array along the first direction and the second direction, the electrode unit has an asymmetric shape, the electrode unit comprises a first electrode unit and a second electrode unit, and the first electrode unit and the second electrode unit are arranged rotationally symmetrically;

in the first direction, the first electrode unit and the second electrode unit are alternately arranged in the same touch electrode; and/or in the second direction, the first electrode unit and the second electrode unit are alternately arranged in the same touch electrode.

Beneficial Effect:

In the embodiments of the application, the embodiments of the application provide a display panel and a display terminal. Touch wires include a first touch wiring portion arranged along a first direction and a second touch wiring portion arranged along a second direction. Through an arrangement of the second touch wiring portion, the touch wires are concentrated and extended from a display area to a non-display area. Touch binding terminals can be designed in a centralized manner, and a width of a frame on which the touch binding terminals are arranged in the first direction and the second direction is reduced.

DESCRIPTION OF DRAWINGS

In order to more clearly illustrate the technical solutions in the embodiments of the present application, the following will briefly introduce the drawings that need to be used in the description of the embodiments. Obviously, the drawings in the following description are only some embodiments of the present application. For those skilled in the art, without creative work, other drawings can be obtained based on these drawings.

DETAILED DESCRIPTION OF PREFERRED EMBODIMENTS

The technical solutions in the embodiments of the present application will be clearly and completely described below in conjunction with the drawings in the embodiments of the present application. Obviously, the described embodiments are only a part of the embodiments of the present application, rather than all the embodiments. Based on the embodiments in this application, all other embodiments obtained by those skilled in the art without creative work shall fall within the protection scope of this application. In addition, it should be understood that the specific implementations described here are only used to illustrate and explain the application and are not used to limit the application. In this application, if no explanation is made to the contrary, the orientation words used such as "upper" and "lower" generally refer to the upper and lower directions of the device in actual use or working state, and specifically refer to the drawing directions in the drawings. "Inner" and "outer" refer to the outline of the device.

An embodiment of the present application provides a display panel, wherein the display panel includes: a light emitting layer comprising light emitting pixels arranged along a first direction and a second direction, wherein the first direction is different from the second direction; a touch layer disposed on a side of the light emitting layer, wherein the touch layer comprises touch electrodes and touch wires electrically connected to corresponding touch electrodes; wherein the touch wires comprise a first touch wiring portion provided along the first direction and a second touch wiring portion provided along the second direction; wherein the first touch wiring portion comprises a plurality of first wiring portions arranged along the first direction and arranged on a side adjacent to the light emitting pixel, a plurality of first connecting portions arranged along the first direction and connected to adjacent first wiring portions, and first protruding portions arranged on a side of the first wiring portion and arranged along the second direction, and at least two first protruding portions are provided on a side of one of the first wiring portions; wherein the second touch wiring portion comprises a plurality of second wiring portions arranged along the second direction and arranged on a side adjacent to the light emitting pixel, a plurality of second connecting portions arranged along the second direction and connected to adjacent second wiring portions, and second protruding portions arranged on a side of the second wiring portion and arranged along the first direction, and at least two second protruding portions are provided on a side of one of the second wiring portions.

The embodiment of the application provides a display panel and a display terminal. Detailed descriptions are given below. It should be noted that the order of description in the following embodiments is not meant to limit the preferred order of the embodiments.

First Embodiment

Figure 2:
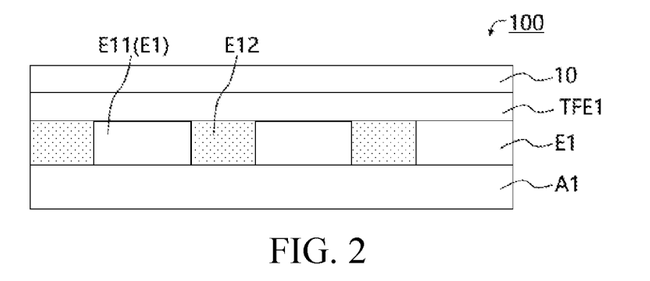
FIG. 2 is a schematic cross-sectional view of a display panel provided by an embodiment of the present application.
Figure 3:
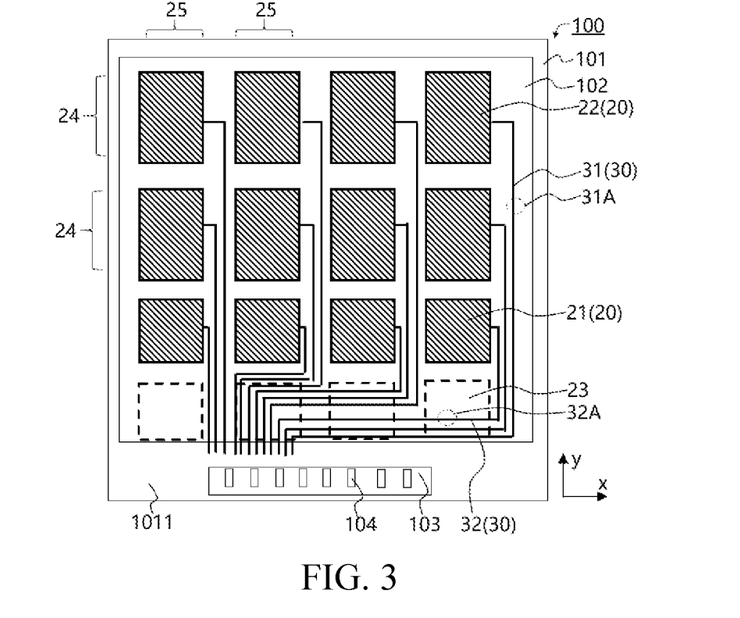
FIG. 3 is a first top view of a touch layer provided by an embodiment of the present application.
Figure 4:
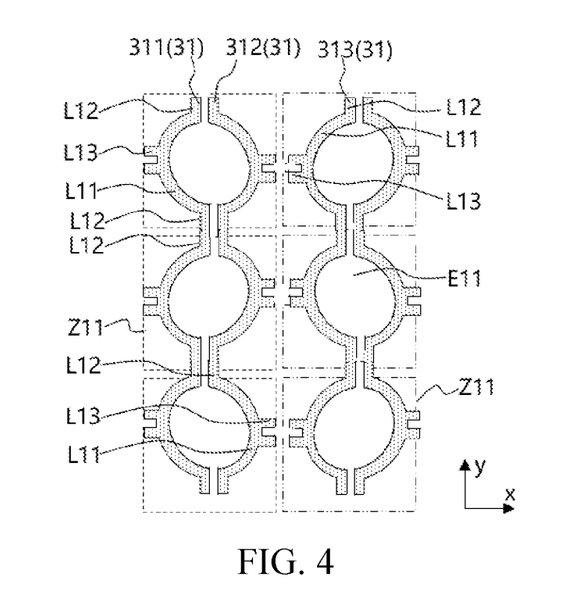
FIG. 4 is a partial schematic diagram of a first touch wiring portion of a touch wire according to an embodiment of the present application.
Figure 5:
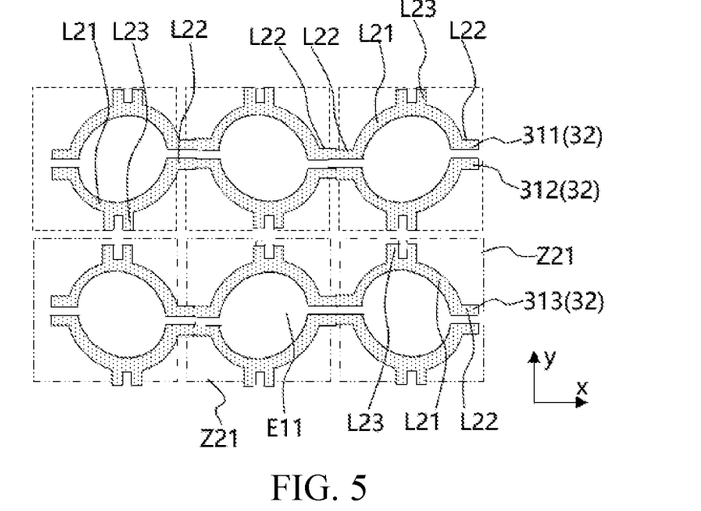
FIG. 5 is a partial schematic diagram of a second touch wiring portion of a touch wire provided by an embodiment of the present application.

Please refer to FIG. 2, FIG. 3, FIG. 4, and FIG. 5. FIG. 2 is a schematic cross-sectional view of a display panel provided by an embodiment of the present application. FIG. 3 is a first top view of a touch layer provided by an embodiment of the present application. FIG. 4 is a partial schematic diagram of a first touch wiring portion of a touch wire according to an embodiment of the present application. FIG. 5 is a partial schematic diagram of a second touch wiring portion of a touch wire provided by an embodiment of the present application.

This embodiment provides a display panel 100. The display panel 100 includes a light emitting layer E1 and a touch layer 10. The light emitting layer E1 includes light emitting pixels E11 arranged along a first direction y and a second direction x, and the first direction y is different from the second direction x. The touch layer 10 is disposed on one side of the light emitting layer E1, and the touch layer 10 includes a touch electrode 20 and a touch wire 30 electrically connected to the corresponding touch electrode 20. The touch wire 30 includes a first touch wiring portion 31 arranged along the first direction y and a second touch wiring portion 32 arranged along the second direction x. The first touch wiring portion 31 includes a plurality of first wiring portions L11 arranged along the first direction y and disposed on the side of the adjacent light emitting pixel E11, a plurality of first connecting portions L12 arranged along the first direction y and connected to adjacent first wiring portions L11, and a first protruding portion L13 arranged on one side of the first wiring portion L11 and arranged along the second direction x. At least two first protruding portions L13 are provided on one side of one first wiring portion L11. The second touch wiring portion 32 includes a plurality of second wiring portions L21 arranged along the second direction x and arranged on the side of the adjacent light emitting pixel E11, a plurality of second connecting portions L22 arranged along the second direction x and connected to adjacent second wiring portions L21, and a second protruding portion L23 arranged on one side of the second wiring portion L21 and arranged along the first direction y. At least two second protruding portions L23 are provided on one side of one second wiring portion L21 correspondingly.

Specifically, the display panel 100 includes a display area 102 and a non-display area 101.

Specifically, as shown in FIG. 2, the display panel 100 may be an organic light emitting display panel. The display panel 100 may include a substrate A1, a light emitting layer E1, a thin film encapsulation layer TFE1, and a touch layer which are sequentially stacked. The substrate A1 may include a plurality of thin-film transistors (TFTs), wires, and other arrangements. The light emitting layer E1 may include a plurality of light emitting pixels E11. A plurality of light emitting pixels E11 are arranged between adjacent pixel definition layers E12. A thin-film encapsulation layer TFE1 can be provided on the light emitting layer E1 to block water and oxygen. The touch layer 10 is disposed on the side of the thin-film encapsulation layer TFE1 away from the light emitting layer E1. Although a structure of the display panel 100 is exemplified here, the structure of the display panel 100 is not limited to this. The display panel 100 may also include other structures and components, and the display panel 100 may also be provided with other types of structures.

Specifically, the light emitting pixels E11 are arranged along the first direction y and the second direction x. The first direction y is different from the second direction x. Preferably, the first direction y and the second direction x are perpendicular to each other.

Specifically, the touch layer 10 includes touch electrodes 20 and touch wires 30 electrically connected to the corresponding touch electrodes 20. The function of the touch electrode includes sensing a touch of a finger. The function of the touch wire 30 includes transmitting a touch driving signal sent by a touch chip and transmitting a finger touch signal fed back by the touch electrode 20.

Specifically, the touch wire 30 includes a first touch wiring portion 31 arranged along the first direction y and a second touch wire portion 32 arranged along the second direction x. FIG. 4 is a partial schematic diagram of a first touch wiring portion of the touch wire provided by an embodiment of the present application. For example, it is an enlarged schematic diagram of a first dashed frame 31A in FIG. 3. FIG. 5 is a partial schematic diagram of a second touch trace portion of the touch trace provided by an embodiment of the application. For example, it is an enlarged schematic diagram of a second dashed frame 32A in FIG. 3.

Specifically, the first touch wiring portion 31 is arranged along the first direction y, which means that the first touch wiring portion 31 extends along the first direction y. The second touch wiring portion 32 is arranged along the second direction x, which means that the second touch wiring portion 32 extends along the second direction x.

Specifically, as shown in FIG. 4, the first touch wiring portion 31 includes a plurality of first wiring portions L11 arranged along the first direction y and arranged on the side of the adjacent light emitting pixel E11, a plurality of first connecting portions L12 arranged along the first direction y and connected to adjacent first wiring portions L11, and a first protruding portion L13 arranged on one side of the first wiring part L11 and arranged along the second direction x. At least two first protruding portion L13 are provided on one side of one first wiring portion L11.

Specifically, as shown in FIG. 5, the second touch wiring portion 32 includes a plurality of second wiring portions L21 arranged along the second direction x and arranged on the side of the adjacent light emitting pixel E11, a plurality of second connecting portions L22 arranged along the second direction x and connected to adjacent second wiring portions L21, and a second protruding portion L23 arranged on one side of the second wiring part L21 and arranged along the first direction y. At least two second protruding portions L23 are provided on one side of one second wiring portion L21 correspondingly.

In the embodiment of the present application, a display panel is provided. The touch wire 30 includes a first touch wiring portion 31 arranged along the first direction y and a second touch wiring portion 32 arranged along the second direction x. Through the arrangement of the second touch wiring portion 32, a plurality of touch wires 30 are arranged next to each other and extend from the display area 102 to the non-display area 101 in a concentrated manner. Thereby, the layout of the touch wires 30 in the non-display area 101 can be made more reasonable, a blind area of the non-display area 101 can be reduced, and multiple touch binding terminals 104 can be designed in a centralized manner. In addition, a width of a frame provided with the touch binding terminal 104 in both the first direction y and the second direction x is reduced, which is beneficial to a portable and narrow frame design of the display panel.

Second Embodiment

This embodiment is the same as or similar to the above-mentioned embodiment, and the difference is that the structure of the touch wire 30 is further described.

In some embodiments, the first wiring portion L11 in one touch wire and the adjacent first wiring portion L11 in the adjacent touch wire 30 are respectively disposed on both sides of the same light emitting pixel E11. Alternatively, the first protruding portion L13 on the first wiring portion L11 in one touch wire 30 and the first protruding portion L13 of the adjacent first wiring portion L11 in the adjacent touch wiring 30 are arranged opposite to each other.

Specifically, as shown in FIG. 4, the touch wire 30 includes a first sub-touch wire 311, a second sub-touch wire 312, and a third sub-touch wire 313 that are adjacently arranged. The first sub-touch wire 311 and the second sub-touch wire 312 are adjacently arranged. The second sub-touch wire 312 and the third sub-touch wire 313 are arranged adjacent to each other. That is, the first touch wiring portion 31 of the first sub-touch wire 311 and the first touch wiring portion 31 of the second sub-touch wire 312 are arranged adjacent to each other. The first touch wiring portion 31 of the second sub-touch wire 312 is adjacent to the first touch wiring portion 31 of the third sub-touch wire 313.

Specifically, as shown in FIG. 4, the first wiring portion L11 in one touch wire 30 and the adjacent first wiring portion L11 in an adjacent touch wire 30 are respectively disposed on both sides of the same light emitting pixel E11. For example, the first touch wiring portion 31 of the first sub-touch wire 311 and the first touch wiring portion 31 of the second sub-touch wire 312 are respectively disposed on both sides of the same light emitting pixel E11. The first wiring portion L11 of the first sub-touch wire 311 and the first wiring portion L11 of the second sub-touch wire 312 are respectively disposed on both sides of the same light emitting pixel E11.

Specifically, as shown in FIG. 4, the first protruding portion L13 on the first wiring portion L11 in one touch wiring 30 and the first protruding portion L13 on the adjacent first wiring portion L11 in the adjacent one of the adjacent touch wires 30 are arranged opposite to each other. For example, the first protruding portion L13 on the first wiring portion L11 of the first touch wiring portion 31 of the second sub-touch wire 312 and the first protruding portion L13 on the adjacent first wiring portion L11 in the adjacent third sub-touch wire 313 are arranged opposite to each other.

More specifically, the opposite setting refers to the setting toward the same point.

Specifically, as shown in FIG. 5, the touch wire 30 includes a first sub-touch wire 311, a second sub-touch wire 312, and a third sub-touch wire 313 that are adjacently arranged. The first sub-touch wire 311 and the second sub-touch wire 312 are adjacently arranged. The second sub-touch wire 312 and the third sub-touch wire 313 are arranged adjacent to each other. That is, the second touch wiring portion 32 of the first sub-touch wire 311 is arranged adjacent to the second touch wiring portion 32 of the second sub-touch wire 312. The second touch wiring portion 32 of the second sub-touch wire 312 is arranged adjacent to the second touch wiring portion 32 of the third sub-touch wire 313.

Specifically, as shown in FIG. 5, the second wiring portion L21 in one touch wire 30 and the adjacent second wiring portion L21 in an adjacent touch wire 30 are respectively disposed on both sides of the same light emitting pixel. For example, the second wiring portion L21 of the first sub-touch wire 311 and the adjacent second wiring portion L21 of the adjacent second sub-touch wire 312 are respectively disposed on both sides of the same light emitting pixel E11.

Specifically, as shown in FIG. 5, the second protruding portion L23 on the second wiring portion L21 in one touch wire 30 and the second protruding portion L23 of the adjacent second wiring portion L21 in the adjacent one of the adjacent touch wire 30 are arranged opposite to each other. For example, the second protruding portion L23 on the second wiring portion L21 of the second sub-touch wire 312 and the second protruding L23 on the adjacent second wire of the adjacent third sub-touch wire 313 are opposite to each other.

In some embodiments, one end of the first protruding portion L13 is connected to the adjacent first wiring portion L11, and the other end thereof extends along the second direction x. One end of the second protruding portion L23 is connected to the adjacent second wiring portion L21, and the other end thereof extends along the first direction y.

In the embodiment of the present application, a display panel is provided. The touch wire 30 includes a first touch wiring portion 31 arranged along the first direction y and a second touch wiring portion 32 arranged along the second direction x. Through the arrangement of the second touch wiring portion 32, a plurality of touch wirings 30 are arranged next to each other and extend from the display area 102 to the non-display area 101 in a concentrated manner. Thereby, the layout of the touch wires 30 in the non-display area 101 can be made more reasonable, and the blind area of the non-display area 101 can be reduced. The multiple touch binding terminals 104 can be designed in a centralized manner. This reduces the width of the frame provided with the touch binding terminal 104 in both the first direction y and the second direction x, which is beneficial to a lightweight and narrow frame design of the display panel.

Third Embodiment

This embodiment is the same as or similar to the above-mentioned embodiment, and the difference is that the structure of the touch wire 30 is further described.

In some embodiments, the adjacent first touch wiring portions 31 of the two adjacent touch wires 30 include a plurality of first repeating units Z11 surrounding the light emitting pixels E11. The first repeating unit Z11 includes two adjacent first wiring portions L11, a first connecting portion L12 connected to the first wiring portion L11, and a first protruding portion L13. The adjacent second touch wiring portions 32 of the two adjacent touch wires 30 include a plurality of second repeating units Z21 surrounding the light emitting pixels E11. The second repeating unit Z21 includes two adjacent second wiring portions L21, a second connecting portion L22 connected to the second wiring portion L21, and a second protruding portion L23. The first repeating unit Z11 and the second repeating unit Z21 are arranged rotationally symmetrically.

Specifically, as shown in FIG. 4, adjacent first touch wiring portions 31 of two adjacent touch wires 30 form a plurality of first repeating units Z11, and the first repeating units Z11 are arranged around the light emitting pixels E11.

Specifically, as shown in FIG. 5, the adjacent second touch wiring portions 32 of the two adjacent touch wires 30 form a plurality of second repeating units Z21, and the second repeating units Z21 are arranged around the light emitting pixels E11.

In some embodiments, in the same first repeating unit Z11, two adjacent first wiring portions L11 are arranged asymmetrically. In the same second repeating unit Z21, two adjacent second wiring portions L21 are arranged asymmetrically.

In some embodiments, one side of the first wiring portion L11 is provided with two first protruding portions L13 correspondingly, and one side of the second wiring portion L21 is provided with two second protruding portions L23 correspondingly.

In some embodiments, the first direction y is perpendicular to the second direction x, and the first repeating unit Z11 and the second repeating unit Z21 are arranged symmetrically with a rotation of 90 degrees.

Specifically, in this embodiment, the first repeating unit Z11 and the second repeating unit Z21 are arranged rotationally symmetrically. This makes the first touch wiring portion 31 and the second touch wiring portion 32 arranged rotationally symmetrically. The difference in metal density of the multiple touch wires of the display panel 100 in the first direction y and the second direction x is reduced. It is even possible to achieve the same metal density of the multiple touch wires of the display panel 100 in the first direction y and the second direction x. Thereby, it is possible to improve or eliminate the undesirable phenomenon of visual fringe-like chromatic aberration (mura) caused by excessive metal density differences in various parts of the touch wire.

Specifically, the multiple touch wires 30 include a plurality of adjacent first touch wiring portions 31. The multiple touch wires 30 include a plurality of adjacent second touch wires 32. The first touch wiring portion 31 extends along the first direction y. The second touch wiring portion 32 extends along the second direction x. The first repeating unit Z11 and the second repeating unit Z21 are arranged rotationally symmetrically. This can eliminate or reduce the difference in metal density caused by the touch wire 30 extending in different directions, thereby improving or eliminating the undesirable phenomenon of visual fringe-like chromatic aberration (mura) caused by the touch wire.

More specifically, the first repeating unit Z11 and the second repeating unit Z21 are arranged symmetrically with a rotation of 90 degrees. This can best eliminate the difference in metal density caused by the extension of the touch wire 30 in different directions, thereby eliminating the undesirable phenomenon of visual streak-like color aberration (mura) caused by the touch wire.

Fourth Embodiment

This embodiment is the same as or similar to the foregoing embodiment, except that the structure and arrangement of the touch layer 10 in the display panel 100 are further described.

Figure 6:
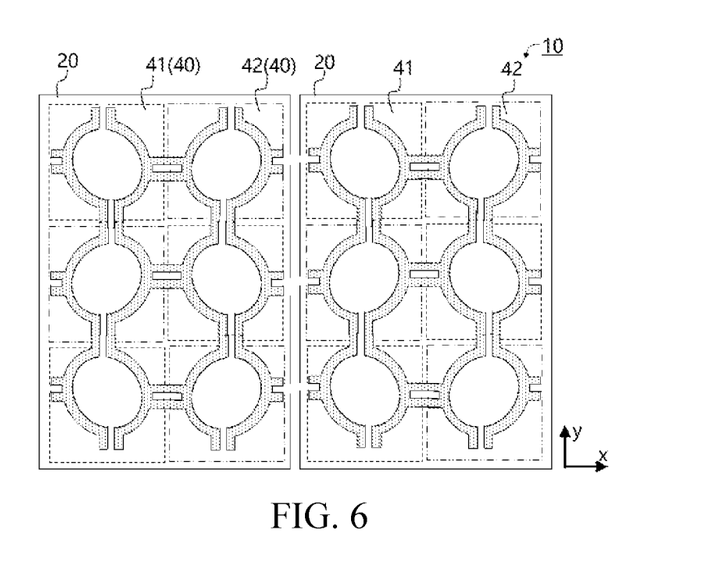
FIG. 6 is a partial schematic diagram of a touch electrode provided by an embodiment of the present application.

Please refer to FIG. 6. FIG. 6 is a partial schematic diagram of a touch electrode provided by an embodiment of the application.

In some embodiments, each touch electrode 20 includes a plurality of electrode units 40 arranged in an array along the first direction y and the second direction x. The electrode unit 40 itself has an asymmetric shape. The electrode unit 40 includes a first electrode unit 41 and a second electrode unit 42. The first electrode unit 41 and the second electrode unit 42 are arranged rotationally symmetrically. In the first direction y, the first electrode unit 41 and the second electrode unit 42 are alternately arranged in the same touch electrode 20, and/or in the second direction x, the first electrode unit 41 and the second electrode unit 42 are alternately arranged in the same touch electrode 20.

Specifically, the touch electrode 20 includes a plurality of electrode units 40. The plurality of electrode units 40 includes a first electrode unit 41 and a second electrode unit 42, and the first electrode unit 41 and the second electrode unit 42 are arranged rotationally symmetrically.

Specifically, in the first direction y, the first electrode unit 41 and the second electrode unit 42 are alternately arranged in the same touch electrode 20. Alternatively, in the second direction x, the first electrode unit 41 and the second electrode unit 42 are alternately arranged in the same touch electrode 20. Alternatively, in the first direction y and the second direction x, the first electrode unit 41 and the second electrode unit 42 are alternately arranged in the same touch electrode 20.

In some embodiments, the first electrode unit 41 and the second electrode unit 42 are symmetrically rotated by 90 degrees.

In some embodiments, the shape of the first electrode unit 41 is the same as the shape of the first repeating unit Z11, and the shape of the second electrode unit 42 is the same as the shape of the second repeating unit Z21.

Specifically, in the first direction y, the first electrode unit 41 and the second electrode unit 42 are alternately arranged in the same touch electrode 20, and/or in the second direction x, the first electrode unit 41 and the second electrode unit 42 are alternately arranged in the same touch electrode 20. The first electrode unit 41 and the second electrode unit 42 are arranged rotationally symmetrically. This can make the metal density in the first direction y and the second direction x consistent within the touch electrode 20. Therefore, it is possible to improve or eliminate the undesirable phenomenon of visual fringe-like chromatic aberration (mura) caused by excessive metal density differences in various parts of the touch electrode 20.

More specifically, when the first electrode unit 41 and the second electrode unit 42 are symmetrically rotated by 90 degrees, the metal density in the first direction y and the second direction x in the touch electrode 20 can be made more uniform. Therefore, it is possible to better improve or eliminate the undesirable phenomenon of visual fringe-like chromatic aberration (mura) caused by the excessive difference in metal density of various parts of the touch electrode 20.

Specifically, the shape of the first electrode unit 41 is the same as the shape of the first repeating unit Z11. The shape of the second electrode unit 42 is the same as the shape of the second repeating unit Z21, so that the metal density of the area where the touch electrode 20 is disposed and the area where the touch trace 30 is disposed can be consistent and uniform. Thereby, the undesirable phenomenon of visual fringe-like chromatic aberration (mura) caused by the excessive difference in the metal density of each part of the touch layer is improved or eliminated.

Fifth Embodiment

This embodiment is the same as or similar to the foregoing embodiment, except that the structure and arrangement of the touch layer 10 in the display panel 100 are further described.

In some embodiments, the display panel 100 includes a display area 102 and a non-display area 101 arranged around the display area 102. The touch electrodes 20 are arranged along the first direction y to form a plurality of touch electrode columns 25. The touch electrodes 20 are arranged along the second direction x to form a plurality of touch electrode rows 24. A blank area 23 is provided between one end of each touch electrode column 25 and the edge of the display area 102. At least a part of the touch wiring 30 is located in the blank area 23.

Specifically, as shown in FIG. 3, the touch electrodes 20 are arranged along the first direction y to form a plurality of touch electrode columns 25. The touch electrodes 20 are arranged along the second direction x to form a plurality of touch electrode rows 24. The touch layer includes a plurality of touch electrode columns 25 and a plurality of touch electrode rows 24.

Specifically, as shown in FIG. 3, a blank area 23 is provided between one end of each touch electrode column 25 and the edge of the display area 102, and at least a part of the touch wire 30 is located in the blank area 23.

Specifically, at least one frame of the non-display area 101 of the display panel 100 is provided with a binding end 103. For example, the display panel 100 includes a first frame area 1011. A binding end 103 is provided on the first frame area 1011. The binding terminal 103 includes a plurality of touch binding terminals 104. The touch wire 30 extends from the display area 102 to the first frame area 1011 and is electrically connected to the touch binding terminal 104.

Specifically, a blank area 23 is provided between one end of the touch electrode column 25 and the edge of the display area 102. That is, a blank area 23 is provided between the touch electrode column 25 and one end adjacent to the first frame area 1011 and the first frame area 1011.

Specifically, at least a part of the touch wire 30 is located in the blank area 23, for example, the first touch wiring portion 31 and/or the second touch wiring portion 32 of the partial touch wire 30 are disposed in the blank area 23.

Further, in some embodiments, the touch electrode column 25 includes a first touch electrode 21 and a second touch electrode 22. The first touch electrode 21 is adjacent to the blank area 23. The second touch electrode 22 is located on the side of the first touch electrode 21 away from the blank area 23. The area of the first touch electrode 21 of each touch electrode column 25 is the same, and the area of the first touch electrode 21 is smaller than the area of the second touch electrode 22.

Specifically, the touch electrode 20 includes a first touch electrode 21 and a second touch electrode 22. The touch electrode 20 adjacent to the blank area 23 in the touch electrode column 25 is the first touch electrode 21. The touch electrode located on the side of the first touch electrode 21 away from the blank area 23 in the touch electrode column 25 is the second touch electrode 22.

Specifically, the area of the first touch electrode 21 is smaller than the area of the second touch electrode 22, leaving a blank area 23. This facilitates the arrangement of at least part of the first touch wiring portion 31 and/or the second touch wiring portion 32 of the touch wire 30. In this way, a plurality of touch wires 30 can be centrally arranged adjacent to each other, and concentratedly extend from the display area 102 to the non-display area 101, so that the display panel has a narrow frame effect.

In some embodiments, the length of the first touch electrode 21 in the first direction y is smaller than the length of the second touch electrode 22 in the first direction y.

Further, specifically, the length of the first touch electrode 21 in the first direction y is smaller than the length of the second touch electrode 22 in the first direction y. This makes the area of the first touch electrode 21 smaller than the area of the second touch electrode 22, leaving a blank area 23. This facilitates the arrangement of at least part of the first touch wiring portion 31 and/or the second touch wiring portion 32 of the touch wire 30.

Specifically, the arrangement of the blank area 23 provides space for at least part of the first touch wiring portion 31 and/or the second touch wiring portion 32 of the touch wire 30. In this way, multiple touch wires 30 can be centrally arranged adjacent to each other and extend from the display area 102 to the non-display area 101 in a concentrated manner. Thereby, the layout of the touch wires 30 in the non-display area 101 can be made more reasonable, and the blind area of the non-display area 101 can be reduced. The multiple touch binding terminals 104 can be designed in a centralized manner, and the width of the frame on which the touch binding terminal 104 is arranged in the first direction y and the second direction x is reduced, which is beneficial to the portable and narrow frame design of the display panel.

Sixth Embodiment

This embodiment is the same as or similar to the foregoing embodiment, except that the structure and arrangement of the touch layer 10 in the display panel 100 are further described.

Figure 7:
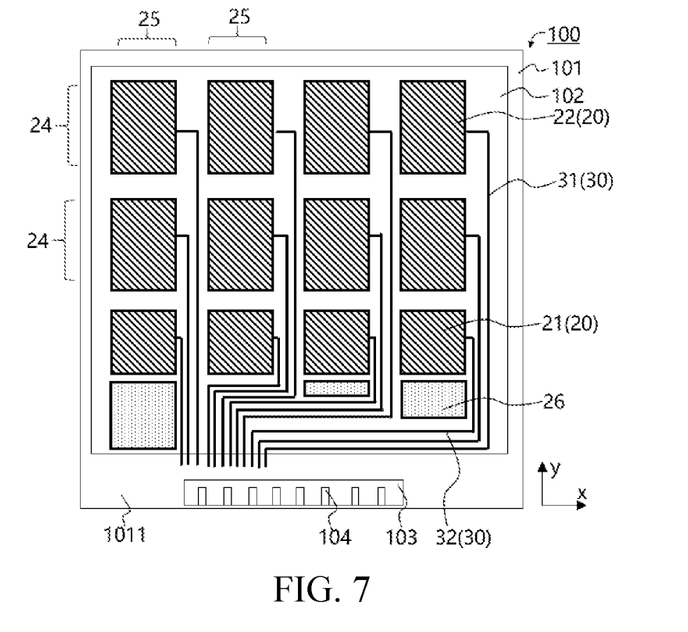
FIG. 7 is a second top view of a touch layer provided by an embodiment of the present application.

Please refer to FIG. 7. FIG. 7 is a second top view of a touch layer provided by an embodiment of the application.

In some embodiments, at least part of the blank area 23 further includes blank touch electrodes 26. The blank touch electrode 26 is floating. The blank touch electrode 26 includes a first electrode unit 41 and a second electrode unit 42 that are the same as the touch electrode 20 of the display area 102.

Specifically, as shown in FIG. 7, the blank touch electrodes 26 are arranged floating, that is, no electrical signals are provided to the blank touch electrodes 26, and only the pattern of the blank touch electrodes 26 is provided.

Specifically, the floating arrangement of the blank touch electrodes 26 means that the blank touch electrodes 26 are not electrically connected to the touch chip through the touch wires 30, and the blank touch electrodes 26 will not be applied with touch signals.

Further, in some embodiments, the area of the blank touch electrode 26 is reduced according to the increase in the number of touch wires 30 located in the blank area 23.

Specifically, as shown in FIG. 3 and FIG. 7, the more the number of touch wires 30 located in the blank area 23 is, the smaller the area where the blank touch electrodes 26 can be provided. It is only necessary to reserve enough space to set the touch wire 30 in the blank area 23. It is possible to further avoid the excessive difference in metal density between the blank area 23 and other areas. It is possible to improve or avoid the undesirable phenomenon of striped mura in the blank area 23 during visual inspection.

In some embodiments, the width of the blank touch electrode 26 in the first direction y decreases according to the increase in the number of touch wires 30 located in the blank area 23.

Specifically, as shown in FIG. 3 and FIG. 7, the area of the blank touch electrode 26 is adjusted. By adjusting the width in the first direction y, enough space is reserved for setting the touch wire 30. This avoids the excessive difference between the metal density of the blank area 23 and other areas and improves the undesirable phenomenon of the striped mura in the blank area 23.

Specifically, the blank touch electrode 26 includes a first electrode unit 41 and a second electrode unit 42 that are the same as the touch electrode 20 of the display area 102. This makes the metal density of the area where the blank touch electrode 26 is disposed and the area where the touch electrode 20 is disposed to be consistent and uniform. Thereby, the undesirable phenomenon of visual fringe-like chromatic aberration (mura) caused by the excessive difference in the metal density between the touch electrode 20 and the blank touch electrode 26 is improved or eliminated.

Seventh Embodiment

Figure 8:
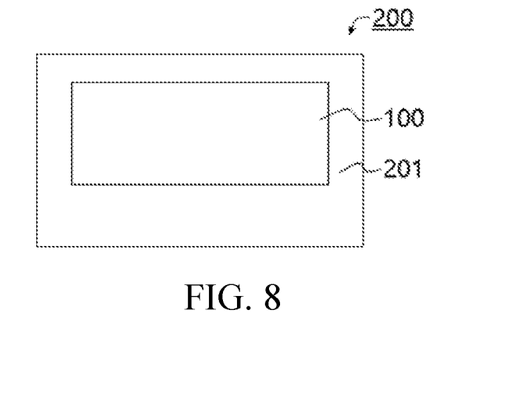
FIG. 8 is a schematic diagram of a display terminal provided by an embodiment of the present application.

As shown in FIG. 8, FIG. 8 is a schematic diagram of a display terminal provided by an embodiment of the application.

The embodiment of the present application also provides a display terminal 200. The display terminal 200 includes a terminal body 201 and the display panel 100 of any one of the above. The terminal body 201 and the display panel 100 are combined into one body.

Specifically, the display terminal 200 may be a mobile phone, a notebook computer, etc., which is not limited here.

The above describes in detail a display panel and a display terminal provided by the embodiments of the present application. Specific examples are used in this article to illustrate the principle and implementation of this application. The description of the above embodiments is only used to help understand the method and core idea of the present application. In addition, for those skilled in the art, based on the idea of the present application, there will be changes in the specific implementation and the scope of application. In summary, the content of this specification should not be construed as a limitation to this application.

What is claimed is:

1. A display panel, comprising:
    a light emitting layer comprising light emitting pixels arranged along a first direction and a second direction, wherein the first direction is different from the second direction;
    a touch layer disposed on a side of the light emitting layer, wherein the touch layer comprises touch electrodes and touch wires electrically connected to corresponding touch electrodes;
    wherein the touch wires comprise a first touch wiring portion provided along the first direction and a second touch wiring portion provided along the second direction;
    wherein the first touch wiring portion comprises a plurality of first wiring portions arranged along the first direction and arranged on a side adjacent to the light emitting pixel, a plurality of first connecting portions arranged along the first direction and connected to adjacent first wiring portions, and first protruding portions arranged on a side of the first wiring portion and arranged along the second direction, and at least two first protruding portions are provided on a side of one of the first wiring portions;
    wherein the second touch wiring portion comprises a plurality of second wiring portions arranged along the second direction and arranged on a side adjacent to the light emitting pixel, a plurality of second connecting portions arranged along the second direction and connected to adjacent second wiring portions, and second protruding portions arranged on a side of the second wiring portion and arranged along the first direction, and at least two second protruding portions are provided on a side of one of the second wiring portions;
    wherein the display panel comprises a display area and a non-display area disposed around the display area, the touch electrodes are arranged along the first direction to form a plurality of touch electrode columns, and the touch electrodes are arranged along the second direction to form a plurality of touch electrode rows; a blank area is disposed between an end of each touch electrode column and an edge of the display area, and at least a part of the touch wires is located in the blank area;
    wherein at least a part of the blank area further comprises blank touch electrodes, the blank touch electrodes are floating, and the blank touch electrodes comprise the same first electrode unit and the second electrode unit as the touch electrodes of the display area; and
    wherein a width of the blank touch electrode in the first direction decreases according to an increase in a number of the touch wires located in the blank area.

2. The display panel according to claim 1, wherein the first wiring portion of one of the touch wires and an adjacent first wiring portion of an adjacent one of the touch wires are respectively arranged on both sides of the same light emitting pixel, or
    the first protruding portion on the first wiring portion of one of the touch wires and the first protruding portion on the adjacent first wiring portion of the adjacent one of the touch wires are arranged opposite to each other.

3. The display panel according to claim 2, wherein an end of the first protruding portion is connected to the adjacent first wiring portion, and another end of the first protruding portion extends along the second direction; an end of the second protruding portion is connected to the adjacent second wiring portion, and another end of the second protruding portion extends along the first direction.

4. The display panel according to claim 1, wherein the adjacent first touch wiring portions of the two adjacent touch wires comprise a plurality of first repeating units surrounding the light emitting pixels, the first repeating unit comprises two adjacent first wiring portions, the first connecting portion connected to the first wiring portion, and the first protruding portion;
    wherein the adjacent second touch wiring portions of the two adjacent touch wires comprise a plurality of second repeating units surrounding the light emitting pixels, the second repeating unit comprises two adjacent second wiring portions, the second connecting portion connected to the second wiring portion, and the second protruding portion;
    wherein the first repeating unit and the second repeating unit are arranged rotationally symmetrically.

5. The display panel according to claim 4, wherein in the same first repeating unit, two adjacent first wiring portions are arranged asymmetrically;
    in the same second repeating unit, two adjacent second wiring portions are arranged asymmetrically.

6. The display panel according to claim 4, wherein a side of the first wiring portion is correspondingly provided with two first protruding portions, and a side of the second wiring portion is correspondingly provided with two second protruding portions.

7. The display panel according to claim 4, wherein the first direction is perpendicular to the second direction, and the first repeating unit and the second repeating unit are arranged symmetrically with a rotation of 90 degrees.

8. The display panel according to claim 4, wherein:
    each of the touch electrodes comprises a plurality of electrode units arranged in an array along the first direction and the second direction, the electrode unit has an asymmetric shape, the electrode unit comprises a first electrode unit and a second electrode unit, and the first electrode unit and the second electrode unit are arranged rotationally symmetrically;
    in the first direction, the first electrode unit and the second electrode unit are alternately arranged in the same touch electrode; and/or
    in the second direction, the first electrode unit and the second electrode unit are alternately arranged in the same touch electrode.

9. The display panel according to claim 8, wherein the first electrode unit and the second electrode unit are arranged symmetrically rotated by 90 degrees.

10. The display panel according to claim 9, wherein:
    a shape of the first electrode unit is same as a shape of the first repeating unit, and a shape of the second electrode unit is same as a shape of the second repeating unit.

11. A display terminal, comprising a terminal body and a display panel, wherein the terminal body and the display panel are combined into one body, and the display panel comprises:
    a light emitting layer comprising light emitting pixels arranged along a first direction and a second direction, wherein the first direction is different from the second direction;
    a touch layer disposed on a side of the light emitting layer, wherein the touch layer comprises touch electrodes and touch wires electrically connected to corresponding touch electrodes;

wherein the touch wires comprise a first touch wiring portion provided along the first direction and a second touch wiring portion provided along the second direction;

wherein the first touch wiring portion comprises a plurality of first wiring portions arranged along the first direction and arranged on a side adjacent to the light emitting pixel, a plurality of first connecting portions arranged along the first direction and connected to adjacent first wiring portions, and first protruding portions arranged on a side of the first wiring portion and arranged along the second direction, and at least two first protruding portions are provided on a side of one of the first wiring portions;

wherein the second touch wiring portion comprises a plurality of second wiring portions arranged along the second direction and arranged on a side adjacent to the light emitting pixel, a plurality of second connecting portions arranged along the second direction and connected to adjacent second wiring portions, and second protruding portions arranged on a side of the second wiring portion and arranged along the first direction, and at least two second protruding portions are provided on a side of one of the second wiring portions;

wherein the display panel comprises a display area and a non-display area disposed around the display area, the touch electrodes are arranged along the first direction to form a plurality of touch electrode columns, and the touch electrodes are arranged along the second direction to form a plurality of touch electrode rows; a blank area is disposed between an end of each touch electrode column and an edge of the display area, and at least a part of the touch wires is located in the blank area;

wherein at least a part of the blank area further comprises blank touch electrodes, the blank touch electrodes are floating, and the blank touch electrodes comprise the same first electrode unit and the second electrode unit as the touch electrodes of the display area; and wherein a width of the blank touch electrode in the first direction decreases according to an increase in a number of the touch wires located in the blank area.

12. The display terminal according to claim 11, wherein the first wiring portion of one of the touch wires and an adjacent first wiring portion of an adjacent one of the touch wires are respectively arranged on both sides of the same light emitting pixel, or the first protruding portion on the first wiring portion of one of the touch wires and the first protruding portion on the adjacent first wiring portion of the adjacent one of the touch wires are arranged opposite to each other.

13. The display terminal according to claim 12, wherein an end of the first protruding portion is connected to the adjacent first wiring portion, and another end of the first protruding portion extends along the second direction;

an end of the second protruding portion is connected to the adjacent second wiring portion, and another end of the second protruding portion extends along the first direction.

14. The display terminal according to claim 11, wherein the adjacent first touch wiring portions of the two adjacent touch wires comprise a plurality of first repeating units surrounding the light emitting pixels, the first repeating unit comprises two adjacent first wiring portions, the first connecting portion connected to the first wiring portion, and the first protruding portion;

wherein the adjacent second touch wiring portions of the two adjacent touch wires comprise a plurality of second repeating units surrounding the light emitting pixels, the second repeating unit comprises two adjacent second wiring portions, the second connecting portion connected to the second wiring portion, and the second protruding portion;

wherein the first repeating unit and the second repeating unit are arranged rotationally symmetrically.

15. The display terminal according to claim 14, wherein in the same first repeating unit, two adjacent first wiring portions are arranged asymmetrically;

in the same second repeating unit, two adjacent second wiring portions are arranged asymmetrically.

16. The display terminal according to claim 14, wherein a side of the first wiring portion is correspondingly provided with two first protruding portions, and a side of the second wiring portion is correspondingly provided with two second protruding portions.

17. The display terminal according to claim 14, wherein the first direction is perpendicular to the second direction, and the first repeating unit and the second repeating unit are arranged symmetrically with a rotation of 90 degrees.

18. The display terminal according to claim 14, wherein:
each of the touch electrodes comprises a plurality of electrode units arranged in an array along the first direction and the second direction, the electrode unit has an asymmetric shape, the electrode unit comprises a first electrode unit and a second electrode unit, and the first electrode unit and the second electrode unit are arranged rotationally symmetrically;

in the first direction, the first electrode unit and the second electrode unit are alternately arranged in the same touch electrode; and/or in the second direction, the first electrode unit and the second electrode unit are alternately arranged in the same touch electrode.

* * * * *